(12) United States Patent
Son et al.

(10) Patent No.: US 12,356,805 B2
(45) Date of Patent: Jul. 8, 2025

(54) DISPLAY DEVICE

(71) Applicant: Samsung Display Co., LTD., Yongin-si (KR)

(72) Inventors: Yong Duck Son, Seongnam-si (KR); Ki-Hoon Ha, Asan-si (KR); Chan-Hyun Park, Cheonan-si (KR); Won Ho Jang, Hwaseong-si (KR); Myung Koo Hur, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 605 days.

(21) Appl. No.: 17/696,413

(22) Filed: Mar. 16, 2022

(65) Prior Publication Data
US 2022/0302231 A1 Sep. 22, 2022

(30) Foreign Application Priority Data
Mar. 17, 2021 (KR) .................. 10-2021-0034736

(51) Int. Cl.
H10K 59/124 (2023.01)
H10K 59/122 (2023.01)
H10K 59/131 (2023.01)
H10K 59/123 (2023.01)
H10K 59/80 (2023.01)

(52) U.S. Cl.
CPC ......... *H10K 59/124* (2023.02); *H10K 59/122* (2023.02); *H10K 59/131* (2023.02); *H10K 59/123* (2023.02); *H10K 59/1315* (2023.02); *H10K 59/80522* (2023.02)

(58) Field of Classification Search
CPC ............... H01K 59/122; H01K 59/124; H01K 59/1315; H01K 50/84; H01L 23/3135; H10K 33/44; H10K 30/88; H10K 59/12–1315; H10K 59/80–95
See application file for complete search history.

(56) References Cited

U.S. PATENT DOCUMENTS

| | | | |
|---|---|---|---|
| 11,101,341 B2* | 8/2021 | Choi | H10K 50/824 |
| 2018/0184501 A1* | 6/2018 | Park | H05B 33/22 |
| 2021/0202568 A1* | 7/2021 | Kim | H01L 33/38 |
| 2022/0416005 A1* | 12/2022 | Zhou | H10K 77/00 |

FOREIGN PATENT DOCUMENTS

| | | |
|---|---|---|
| KR | 10-0950017 | 3/2010 |
| KR | 10-1811027 | 12/2017 |
| KR | 10-2019-0026351 | 3/2019 |
| KR | 10-2019-0094265 | 8/2019 |
| KR | 10-2020-0046224 | 5/2020 |

* cited by examiner

*Primary Examiner* — Shahed Ahmed
*Assistant Examiner* — Adam D Weiland
(74) *Attorney, Agent, or Firm* — KILE PARK REED & HOUTTEMAN PLLC

(57) ABSTRACT

A display device includes a common voltage line disposed on a substrate, a passivation layer disposed on the common voltage line, a connection electrode disposed on the passivation layer and electrically connected to the common voltage line, a pixel definition layer disposed on the connection electrode and including a first opening, an emission layer disposed on the pixel definition layer, and a common electrode disposed on the emission layer and electrically connected to the connection electrode through the first opening, wherein the passivation layer includes a second opening surrounding the first opening.

16 Claims, 22 Drawing Sheets

DISPLAY DEVICE

CROSS-REFERENCE TO RELATED APPLICATION(S)

This application claims priority to and benefits of Korean Patent Application No. 10-2021-0034736 under 35 U.S.C. § 119, filed in the Korean Intellectual Property Office on Mar. 17, 2021, the entire contents of which are incorporated herein by reference.

BACKGROUND

1. Technical Field

The disclosure relates to a display device.

2. Description of the Related Art

A display device is a device that displays a screen, and may include a liquid crystal display (LCD), an organic light emitting diode (OLED), or the like. A display device may be used in various electronic devices such as a mobile phone, a navigation device, a digital camera, an electronic book, a portable game machine, and various terminals.

An organic light emitting diode display may have a self-luminance characteristic, and unlike a liquid crystal display, the thickness and weight thereof can be reduced since a separate light source may not be required. Further, since the organic light emitting diode display has high quality characteristics such as low power consumption, high luminance, and high reaction speed, an OLED display is appropriate for use in a mobile electronic device.

An organic light emitting device may include pixels including an organic light emitting diode of a self-light-emitting element, and each pixel may include transistors and at least one capacitor for driving the organic light emitting diode. Transistors may basically include a switching transistor and a driving transistor.

An insulating layer may be positioned between these transistors and electrodes. The insulating layer may be made of an organic material, and the organic material may generate a gas inside the insulating layer during a manufacturing process, for example, during a laser drilling process. The generated gas may move inside the insulating layer and may not be discharged due to being shielded by the electrode positioned on the insulating layer. There may be a problem that defects may occur due to the influence of this gas on the electrode, wiring, and light-emitting elements positioned on the insulating layer.

The above information disclosed in this Background section is only for enhancement of understanding of the background of the described technology, and therefore it may include information that does not form the prior art that is already known in this country to a person of ordinary skill in the art.

SUMMARY

Embodiments may provide a display device capable of preventing defects such as of the electrodes, wiring, light-emitting elements, etc.

A display device according to an embodiment may include a common voltage line disposed on a substrate, a passivation layer disposed on the common voltage line, a connection electrode disposed on the passivation layer and electrically connected to the common voltage line, a pixel definition layer disposed on the connection electrode and including a first opening, an emission layer disposed on the pixel definition layer, and a common electrode disposed on the emission layer and electrically connected to the connection electrode through the first opening, wherein the passivation layer may include a second opening surrounding the first opening.

The connection electrode may be disposed within the second opening.

The connection electrode may cover a side of the passivation layer within the second opening.

A portion of the passivation layer surrounded by the second opening and a portion of the passivation layer disposed outside the second opening may be separated by the connection electrode.

The second opening may have a closed loop shape in a plan view.

The first opening may not overlap the second opening.

The passivation layer may include a first passivation layer including an inorganic insulating material, and a second passivation layer disposed on the first passivation layer and including an organic insulating material.

The second opening may be disposed in the second passivation layer and may not be formed in the first passivation layer.

The second opening may be in the first passivation layer and the second passivation layer.

The connection electrode may be electrically connected to the common voltage line through the second opening.

The connection electrode may include a third opening, and the third opening may be surrounded by the second opening.

The third opening may overlap a portion of the passivation layer surrounded by the second opening.

The pixel definition layer may further include a fourth opening overlapping the third opening.

A size of the fourth opening may be smaller than a size of the third opening in plan view.

The pixel definition layer may cover a side of the connection electrode within the third opening.

The emission layer may not be disposed in at least a partial region within the first opening.

A display device according to an embodiment may include a common voltage line disposed on a substrate, a passivation layer disposed on the common voltage line, a connection electrode disposed on the passivation layer and electrically connected to the common voltage line, a pixel definition layer disposed on the connection electrode and including an opening, an emission layer disposed on the pixel definition layer, and a common electrode disposed on the emission layer and electrically connected to the connection electrode through the opening, wherein the connection electrode may include another opening, and the another opening may surround the opening.

The another opening may be covered by the pixel definition layer.

The another opening may have an opened loop shape in a plan view.

The opening may not overlap the another opening.

According to an embodiment, it may be possible to prevent defects of the electrodes, the wiring, and the light-emitting elements of the display device.

DETAILED DESCRIPTION OF THE EMBODIMENTS

Figure 1:
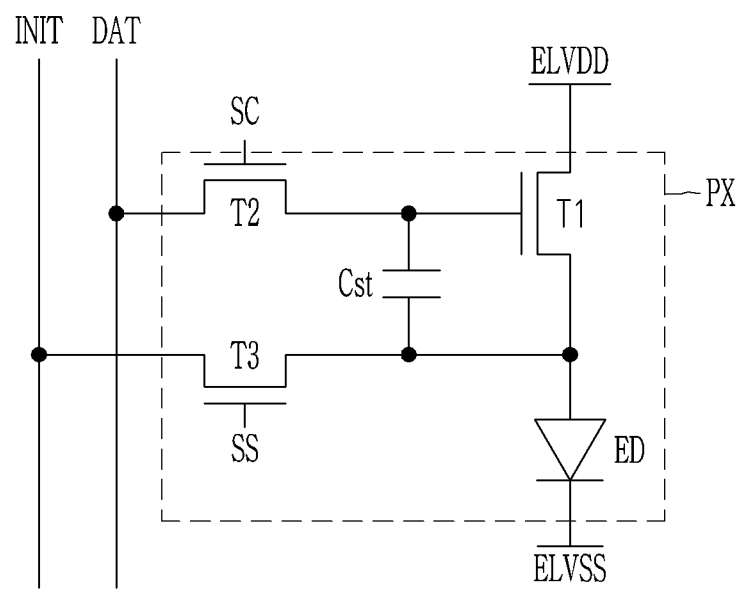
FIG. 1 is a schematic circuit diagram of a pixel of a display device according to an embodiment.

The disclosure will be described more fully hereinafter with reference to the accompanying drawings, in which embodiments are shown. As those skilled in the art would realize, the described embodiments may be modified in various different ways, all without departing from the spirit or scope of the disclosure.

The drawings and description are to be regarded as illustrative in nature and not restrictive. Like reference numerals designate like elements throughout the specification.

Further, since sizes and thicknesses of constituent members shown in the accompanying drawings may be arbitrarily given for better understanding and ease of description, the embodiments are not limited to the illustrated sizes and thicknesses. In the drawings, the thickness of layers, films, panels, regions, etc., may be exaggerated for clarity.

As used herein, the singular forms, "a," "an," and "the" are intended to include the plural forms as well (and vice versa), unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that when an element such as a layer, film, region, or substrate is referred to as being "on" another element, it can be directly on the other element or intervening elements may also be present. In contrast, when an element is referred to as being "directly on" another element, there may be no intervening elements present. In addition, the word "on" means positioning on or below the object portion, but does not necessarily mean positioning on the upper side of the object portion based on a gravity direction.

In addition, unless explicitly described to the contrary, the words "comprise", "has", "have" and "include" and variations such as "comprises", "comprising", "having", "includes" and "including" will be understood to imply the inclusion of stated elements but not the exclusion of any other elements.

Further, in the specification, the phrase "in a plan view" means when an object portion is viewed from above, and the phrase "in a cross-sectional view" means when a cross-section taken by vertically cutting an object portion is viewed from the side.

It will be understood that the terms "connected to" or "coupled to" may include a physical or electrical connection or coupling.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

When an element is described as 'not overlapping' or 'to not overlap' another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

First, a display device according to an embodiment is described with reference to FIG. 1.

FIG. 1 is a schematic circuit diagram of a pixel of a display device according to an embodiment.

A display device according to an embodiment may include pixels PX. Each of the pixels PX, as shown in FIG. 1, may include transistors T1, T2, and T3, a capacitor Cst, and at least one light emitting diode (LED) ED of a light-emitting element. In an embodiment, an example that one pixel PX may include one light emitting diode (LED) ED is described.

Transistors T1, T2 and T3 may include a driving transistor T1, a switching transistor T2, and an initialization transistor T3. The first electrode and the second electrode to be described below are used to distinguish two electrodes disposed on respective sides of the channel of each transistor T1, T2 and T3, and may be a source electrode or a drain electrode.

A gate electrode of the driving transistor T1 may be connected to a terminal of the capacitor Cst, the first electrode of the driving transistor T1 may be connected to a driving voltage line transmitting a driving voltage ELVDD, and a second electrode of the driving transistor T1 may be connected to an anode of the light emitting diode (LED) ED and another terminal of the capacitor Cst. The driving transistor T1 may receive a data voltage DAT depending on a switching operation of the switching transistor T2 to supply a driving current to the light emitting diode (LED) ED depending on the voltage stored in the capacitor Cst.

A gate electrode of the switching transistor T2 may be connected to a first scan line transmitting a first scan signal SC, a first electrode of the switching transistor T2 may be connected to a data line capable of transmitting a data voltage DAT or a reference voltage, and a second electrode of the switching transistor T2 may be connected to a terminal of the capacitor Cst and the gate electrode of the driving transistor T1. The switching transistor T2 may be turned on according to the first scan signal SC to transmit the reference voltage or the data voltage DAT to the gate electrode of the driving transistor T1 and an end of the capacitor Cst.

A gate electrode of the initialization transistor T3 may be connected to a second scan line transmitting a second scan signal SS, a first electrode of the initialization transistor T3 may be connected to another terminal of the capacitor Cst, the second electrode of the driving transistor T1 and the anode of the light emitting diode (LED) ED, and the second electrode of the initialization transistor T3 may be connected to an initialization voltage line transmitting an initialization voltage INIT. The initialization transistor T3 may be turned on depending on the second scan signal SS to transmit the initialization voltage INIT to the anode of the light emitting diode (LED) ED and another terminal of the capacitor Cst, thereby initializing the voltage of the anode of the light emitting diode (LED) ED.

A terminal of the capacitor Cst may be connected to the gate electrode of the driving transistor T1, and another terminal thereof may be connected to the first electrode of the initialization transistor T3 and the pixel electrode as the anode of the light emitting diode (LED) ED. The common electrode as a cathode of the light emitting diode (LED) ED may be connected to the common voltage line transmitting a common voltage ELVSS.

The light emitting diode (LED) ED may emit light of a luminance according to the driving current generated by the driving transistor T1.

In the above, it has been described that one pixel PX may include three transistors T1, T2, and T3 and one capacitor Cst, but is not limited thereto, and the number of the transistors, the number of the capacitors, and their connection relationships may be changed in various ways.

Next, an example of the operation of the circuit shown in FIG. 1, particularly an example of the operation during a frame, is described. Here, the transistors T1, T2, and T3 are described with an example of an N-type channel transistor, but embodiments are not limited thereto.

If a frame starts, in an initialization period, a first scan signal SC of a high level and a second scan signal SS of a high level may be supplied and the switching transistor T2 and the initialization transistor T3 may be turned on. The reference voltage from the data line may be supplied to the gate electrode of the driving transistor T1 and a terminal of the capacitor Cst through the turned-on switching transistor T2, and the initialization voltage INIT may be supplied to the second electrode of the driving transistor T1 and the anode of the light emitting diode (LED) ED through the turned-on initialization transistor T3. Accordingly, during an initialization period, the second electrode of the driving transistor T1 and the anode of the light emitting diode (LED) ED may be initialized into the initialization voltage INIT. A difference voltage of the reference voltage and the initialization voltage INIT may be stored to the capacitor Cst.

In a sensing period, in a state that the first scan signal SC of a high level may be maintained, if the second scan signal SS becomes low level, the switching transistor T2 may maintain the turned-on state and the initialization transistor T3 may be turned off. The gate electrode of the driving transistor T1 and a terminal of the capacitor Cst may maintain the reference voltage through the turned-on switching transistor T2, and the second electrode of the driving transistor T1 and the anode of the light emitting diode (LED) ED may be disconnected from the initialization voltage INIT through the turned-off initialization transistor T3. Accordingly, the driving transistor T1 may be turned off in case that the current flows from the first electrode to the second electrode and the voltage of the second electrode becomes "a reference voltage-Vth". Vth represents a threshold voltage of the driving transistor T1. At this time, the voltage difference between the gate electrode and the second electrode of the driving transistor T1 may be stored in the capacitor Cst, and the sensing of the threshold voltage Vth of the driving transistor T1 may be completed. By generating a compensated data signal by reflecting the characteristic information sensed during the sensing period, the characteristic deviation of the driving transistor T1, which may be different for each pixel, may be externally compensated.

In the data input period, in case that the first scan signal SC of a high level is supplied and the second scan signal SS of a low level is supplied, the switching transistor T2 may be turned on and the initialization transistor T3 may be turned off. Through the turned-on switching transistor T2, the data voltage DAT from the data line may be supplied to the gate electrode of the driving transistor T1 and a terminal of the capacitor Cst. At this time, the second electrode of the driving transistor T1 and the anode of the light emitting diode (LED) ED may maintain the potential in the sensing period almost as it is by the driving transistor T1, which may be in the turned-off state.

The driving transistor T1 turned on by the data voltage DAT transmitted to the gate electrode in an emission period may generate a driving current according to the data voltage DAT, and the light emitting diode (LED) ED may emit light by the driving current.

A connection part of the common electrode that may be the cathode of the light emitting diode (LED) ED and the common voltage line transmitting the common voltage ELVSS is described with reference to FIG. 2 to FIG. 6.

Figure 2:
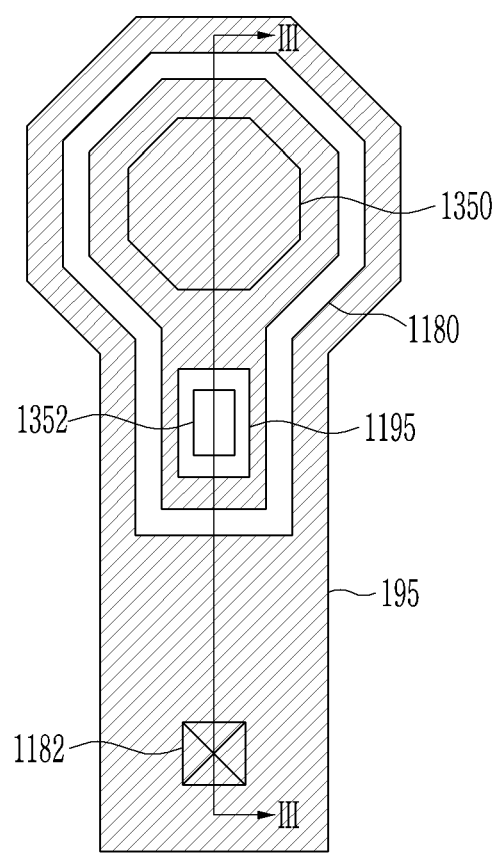
FIG. 2 is a schematic top plan view showing a part of a display device according to an embodiment.
Figure 3:
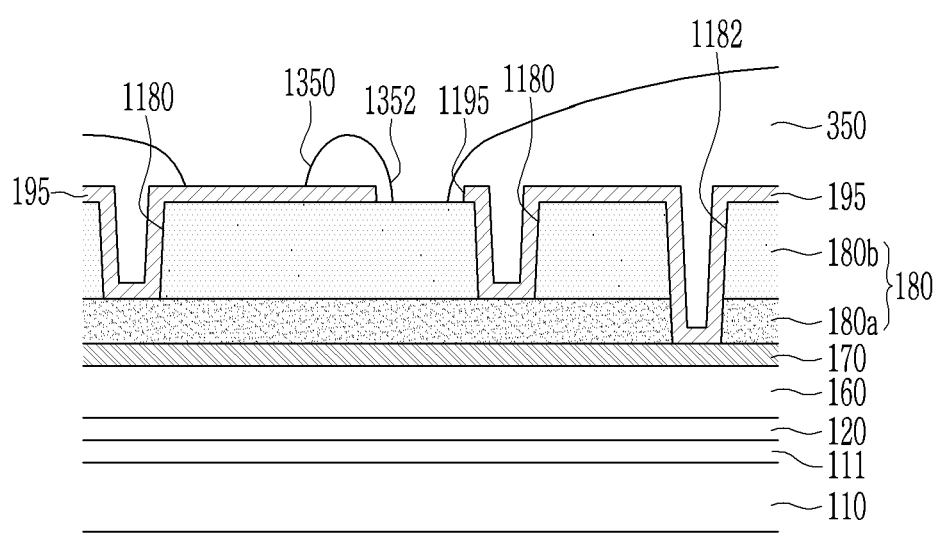
FIG. 3 is a schematic cross-sectional view taken along line III-III of FIG. 2.
Figure 4:
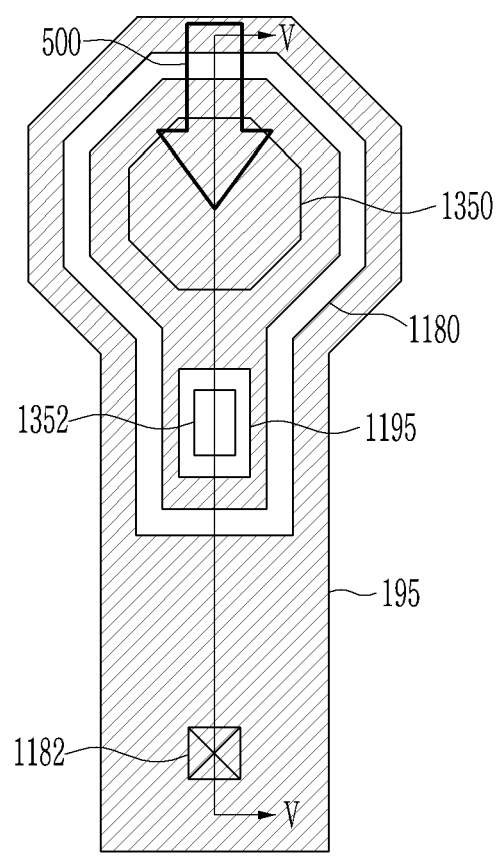
FIG. 4 and FIG. 5 are schematic views showing a part where laser processing may be performed to a display device according to an embodiment.
Figure 5:
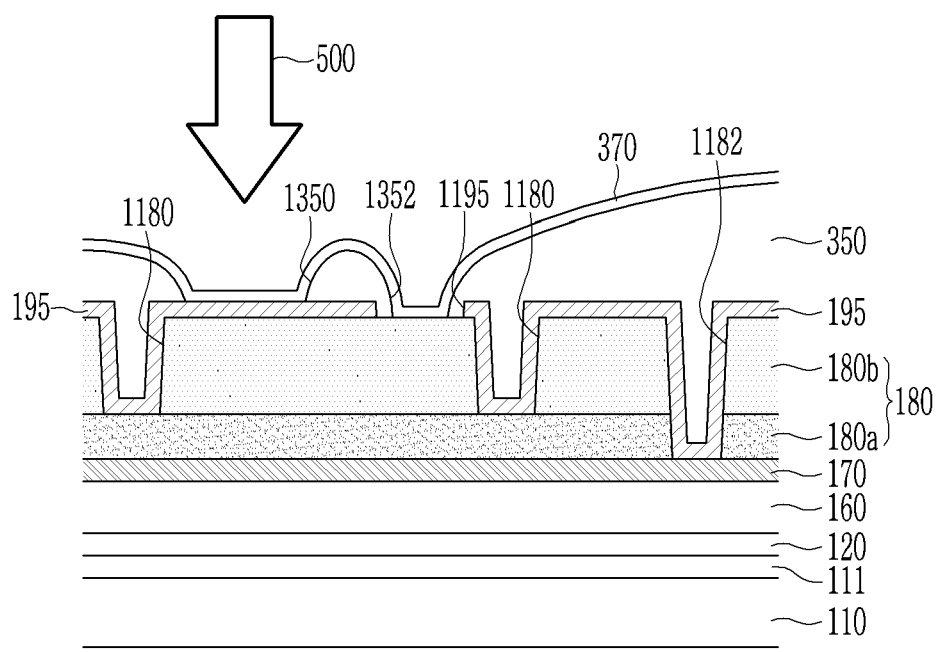
Figure 6:
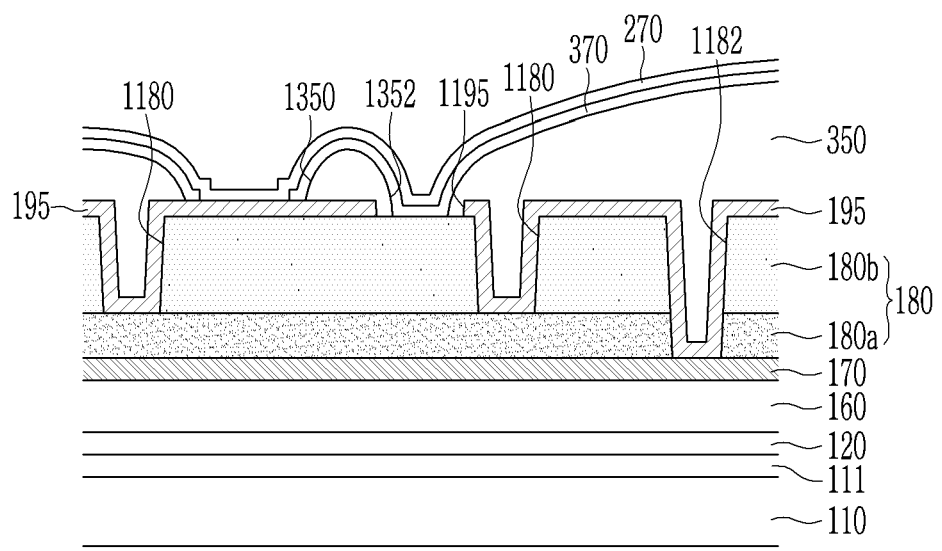
FIG. 6 is a schematic cross-sectional view showing a state that a common electrode may be formed after laser processing.

FIG. 2 is a schematic top plan view showing a part of a display device according to an embodiment, and FIG. 3 is a schematic cross-sectional view taken along line III-III of FIG. 2. FIG. 4 and FIG. 5 are schematic views showing a part where laser processing may be performed to a display device according to an embodiment. FIG. 5 is a schematic cross-sectional view taken along line V-V of FIG. 4. FIG. 6 is a schematic cross-sectional view showing a state that a common electrode may be formed after laser processing.

First, as shown in FIG. 2 and FIG. 3, the display device according to an embodiment may include a substrate 110, and a buffer layer 111 of an insulating layer may be disposed on the substrate 110. Although not shown, a first conductive layer may be disposed between the substrate 110 and the buffer layer 111. The first insulating layer 120 may be disposed on the buffer layer 111. Although not shown, a semiconductor layer may be disposed between the buffer layer 111 and the first insulating layer 120. A second insulating layer 160 may be disposed on the first insulating layer 120. Although not shown, a second conductive layer may be disposed between the first insulating layer 120 and the second insulating layer 160.

A third conductive layer including a common voltage line 170 may be disposed on the second insulating layer 160. The planar shape of the common voltage line 170 is not shown, but may be elongated along a direction. The common voltage ELVSS may be applied to the common voltage line 170. An auxiliary line that transmits the common voltage ELVSS to the first conductive layer or the second conductive layer may be additionally disposed, and this auxiliary line may be electrically connected to the common voltage line 170.

A passivation layer 180 may be disposed on the third conductive layer including the common voltage line 170. The passivation layer 180 may include a first passivation layer 180a and a second passivation layer 180b. The second passivation layer 180b may be disposed on the first passivation layer 180a.

At least one of the first conductive layer, the second conductive layer and the third conductive layer may include at least one of copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), and their alloys. Each of the first conductive layer, the second conductive layer, and the third conductive layer may be composed of a single layer or multiple layers. For example, it may have a multilayer structure including a lower layer including titanium and an upper layer including copper.

At least one of the buffer layer 111, the first insulating layer 120, the second insulating layer 160, and the passivation layer 180 may include an inorganic insulating material such as a silicon nitride (SiNx), a silicon oxide (SiOx), a silicon oxynitride (SiON), and/or an organic insulating material such as a polyimide, an acryl-based polymer, and a siloxane-based polymer. The first passivation layer 180a of the passivation layer 180 may be formed of an inorganic insulating material, and the second passivation layer 180b may be formed of an organic insulating material.

A fourth conductive layer including a connection electrode 195 may be disposed on the passivation layer 180. The fourth conductive layer may include a transparent metal oxide such as ITO (Indium Tin Oxide), IZO (Indium Zinc Oxide), etc. The fourth conductive layer may be made of multiple layers. For example, the fourth conductive layer may be formed of a triple layer in which a layer including ITO, a layer including silver (Ag), and a layer including ITO may be sequentially stacked on each other. The planar shape of the connection electrode 195 may be made of polygons. For example, the connection electrode 195 may have a shape including a portion formed of an approximately octagonal shape and a portion protruded from a side of the octagonal shape.

The passivation layer 180 may include a second opening 1180 and a sixth opening 1182. The second opening 1180 and the sixth opening 1182 refer to the region from which the passivation layer 180 has been removed. The second opening 1180 and the sixth opening 1182 may overlap the common voltage line 170. The second opening 1180 may be formed only in the second passivation layer 180b and may not be formed in the first passivation layer 180a. The sixth opening 1182 may be formed in the first passivation layer 180a and the second passivation layer 180b. Accordingly, the depth of the sixth opening 1182 may be formed deeper than the depth of the second opening 1180. The upper surface of the common voltage line 170 may be exposed by the sixth opening 1182. The upper surface of the common voltage line 170 overlapping the second opening 1180 may not be exposed. The second opening 1180 and the sixth opening 1182 may overlap the connection electrode 195. The second opening 1180 may overlap the approximately octagonal portion of the connection electrode 195 and the surrounding region. The sixth opening 1182 may overlap the protruded part of the connection electrode 195. The connection electrode 195 may be disposed in the second opening 1180 and the sixth opening 1182. The connection electrode 195 may be formed to cover the side of the second passivation layer 180b within the second opening 1180. The second opening 1180 of the passivation layer 180 may be formed of a closed loop shape to surround a region. The portion of the second passivation layer 180b surrounded by the second opening 1180 may be completely separated from the portion of the second passivation layer 180b disposed outside the second opening 1180. The connection electrode 195 in the second opening 1180 may block a portion between the portion of the second passivation layer 180b surrounded by the second opening 1180 and the portion of the second passivation layer 180b disposed outside the second opening 1180. The connection electrode 195 may be formed to cover the side surfaces of the first passivation layer 180a and the second passivation layer 180b within the sixth opening 1182. The connection electrode 195 may be formed to cover the upper surface of the common voltage line 170 within the sixth opening 1182. Thus, the connection electrode 195 may be connected to the common voltage line 170 through the sixth opening 1182.

The connection electrode 195 may include a third opening 1195. The planar shape of the third opening 1195 of the connection electrode 195 may be approximately quadrangular. The second opening 1180 of the passivation layer 180 may have a shape surrounding a region, and the third opening 1195 of the connection electrode 195 may be disposed within the region surrounded by the second opening 1180. The third opening 1195 of the connection electrode 195 may not overlap the second opening 1180. At least part of the passivation layer 180 may be exposed by the third opening 1195 of the connection electrode 195. A part of the upper surface of the second passivation layer 180b may be exposed.

A pixel definition layer 350 may be disposed on the fourth conductive layer of the connection electrode 195. The pixel definition layer 350 may include an organic insulating material such as a polyacryl-based resin or a polyimide-based resin. The pixel definition layer 350 may include a first opening 1350 and a fourth opening 1352.

The first opening 1350 of the pixel definition layer 350 may overlap the connection electrode 195. The first opening 1350 of the pixel definition layer 350 may overlap the octagonal part of the connection electrode 195. The first opening 1350 of the pixel definition layer 350 may overlap the central portion of the octagonal portion of the connection electrode 195. The first opening 1350 of the pixel definition layer 350 may overlap the passivation layer 180. The first opening 1350 of the pixel definition layer 350 may be disposed within the region surrounded by the second opening 1180 of the passivation layer 180. The first opening 1350 of the pixel definition layer 350 may not overlap the second opening 1180 of the passivation layer 180. At least a portion of the connection electrode 195 may be exposed by the first opening 1350 of the pixel definition layer 350.

The fourth opening 1352 of the pixel definition layer 350 may overlap the third opening 1195 of the connection electrode 195. The fourth opening 1352 of the pixel definition layer 350 may be disposed within the third opening 1195 of the connection electrode 195. The planar size of the fourth opening 1352 of the pixel definition layer 350 may be smaller than the planar size of the third opening 1195 of the connection electrode 195. The side of the connection electrode 195 may be exposed by the third opening 1195 of the connection electrode 195. The layer including silver (Ag) disposed in the center of the connection electrode 195 formed of the triple layer may be exposed. In the display device according to an embodiment, since the pixel definition layer 350 may be formed to cover the edge of the third opening 1195 of the connection electrode 195, it may be possible to prevent the side surface of the connection electrode 195 from being exposed. For example, the pixel definition layer 350 may be formed to cover the side of the connection electrode 195 within the third opening 1195 of the connection electrode 195. Accordingly, the layer including silver (Ag) disposed in the center of the connection electrode 195 may be protected. At least part of the passivation layer 180 may be exposed by the fourth opening 1352 of the pixel definition layer 350. A part of the upper surface of the second passivation layer 180b may be exposed.

As shown in FIG. 4 and FIG. 5, an emission layer 370 may be disposed on the pixel definition layer 350. The emission layer 370 may be disposed on the substrate 110 (e.g., entire substrate), and may also be disposed within the first opening 1350 and the fourth opening 1352 of the pixel definition layer 350. The emission layer 370 may include an organic light emitting material or an inorganic light emitting material.

A laser 500 may be irradiated on the part corresponding to the first opening 1350 of the pixel definition layer 350. For example, a laser drilling process may be performed, and accordingly, as shown in FIG. 6, a portion of the emission layer 370 disposed within the first opening 1350 of the pixel definition layer 350 may be removed. Accordingly, the emission layer 370 may not be disposed in at least some regions within the first opening 1350 of the pixel definition layer 350. As the part of the emission layer 370 may be removed, the connection electrode 195 disposed under the emission layer 370 may be exposed. For example, a portion of the connection electrode 195 overlapping the first opening 1350 of the pixel definition layer 350 may be exposed.

A common electrode 270 may be disposed on the emission layer 370. The common electrode 270 may include a metal material including silver (Ag) or a transparent metal oxide such as Indium Tin Oxide (ITO) or Indium Zinc Oxide (IZO). The common electrode 270 may be disposed on the substrate 110 (e.g., entire substrate). The common electrode 270 may be disposed within the first opening 1350 of the pixel definition layer 350. The common electrode 270 may be connected to the connection electrode 195 through the first opening 1350 of the pixel definition layer 350. The common electrode 270 may be connected to the common voltage line 170 through the connection electrode 195 and may receive the common voltage ELVSS.

Next, a pixel of the display device according to an embodiment is described with reference to FIG. 7.

Figure 7:
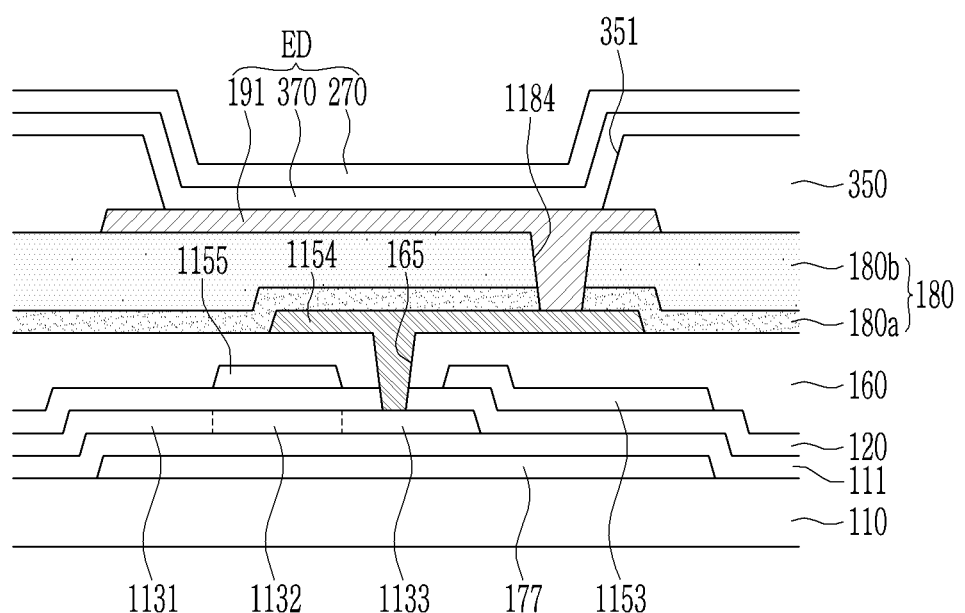
FIG. 7 is a schematic cross-sectional view showing a pixel of a display device according to an embodiment.

FIG. 7 is a schematic cross-sectional view showing a pixel of a display device according to an embodiment.

As shown in FIG. 7, a first conductive layer disposed on a substrate 110 may include a light blocking pattern 177. A buffer layer 111 may be disposed on the light blocking pattern 177. A semiconductor layer disposed on the buffer layer 111 may include a channel 1132, a first region 1131, and a second region 1133 of a driving transistor T1. The channel 1132 of the driving transistor T1 may be disposed between the first region 1131 and the second region 1133. A first insulating layer 120 may be disposed on the semiconductor layer.

A second conductive layer disposed on the first insulating layer 120 may include a gate electrode 1155 and a lower storage electrode 1153 of the driving transistor T1. The gate electrode 1155 of the driving transistor T1 may overlap the channel 1132 of the driving transistor T1. The gate electrode 1155 of the driving transistor T1 may be connected to the lower storage electrode 1153 and may be formed integrally therewith. After forming the second conductive layer, a doping process or plasma treatment may be performed. The part of the semiconductor layer covered by the second conductive layer may not be doped or plasma-treated, and the part of the semiconductor layer that may not be covered by the second conductive layer may be doped or plasma-treated, so that it may have a same characteristic as the conductor. The channel 1132 of the driving transistor T1 may not be doped or plasma treated. The first region 1131 and the second region 1133 of the driving transistor T1 may have a same characteristic as a conductor and may be a first electrode and a second electrode, respectively.

A second insulating layer 160 may be disposed on the second conductive layer. A third conductive layer disposed on the second insulating layer 160 may include an upper storage electrode 1154. The upper storage electrode 1154 may be disposed on a same layer as the common voltage line 170. The upper storage electrode 1154 and the common voltage line 170 may include a same material and may be formed together in a same process. The upper storage electrode 1154 may overlap the lower storage electrode 1154. The lower storage electrode 1153 and the upper storage electrode 1154 may overlap each other with a second insulating layer 160 therebetween to form a capacitor Cst. The lower storage electrode 1153 may also overlap the light blocking pattern 177 with the first insulating layer 120 therebetween, so that a double capacitor Cst may be formed. The upper storage electrode 1154 may overlap the second region 1133 of the driving transistor T1. The second insulating layer 160 may include an opening 165 overlapping the upper storage electrode 1154 and the second region 1133 of the driving transistor T1. The opening 165 may be further formed in the first insulating layer 120. The upper storage electrode 1154 may be connected to the second region 1133 of the driving transistor T1 through the opening 165.

A passivation layer 180 may be disposed on the third conductive layer, and the passivation layer 180 may include a first passivation layer 180a and a second passivation layer 180b disposed on the first passivation layer 180a.

A fourth conductive layer disposed on the passivation layer 180 may include a pixel electrode 191. The pixel electrode 191 may be disposed on a same layer as the connection electrode 195. The pixel electrode 191 and the connection electrode 195 may include a same material and may be formed together in a same process. The pixel electrode 191 may overlap the upper storage electrode 1154. The passivation layer 180 may include a third opening 1184 overlapping the pixel electrode 191 and the upper storage electrode 1154. The pixel electrode 191 may be connected to the upper storage electrode 1154 through the third opening 1184.

A pixel definition layer 350 may be disposed on the fourth conductive layer. The pixel definition layer 350 may include a pixel opening 351. The pixel opening 351 may overlap the pixel electrode 191.

An emission layer 370 may be disposed on the pixel definition layer 350 and the emission layer 370 may be disposed within the pixel opening 351. The emission layer 370 may be in contact with the pixel electrode 191 within the pixel opening 351. For example, the emission layer 370 may be disposed on (e.g., directly on) the pixel electrode 191 within the pixel opening 351.

A common electrode 270 may be disposed on the emission layer 370. The common electrode 270 may be in contact with the emission layer 370 and may be disposed on (e.g., directly on) the emission layer 370. The pixel electrode 191, the emission layer 370, and the common electrode 270 may be sequentially stacked on each other on the pixel opening 351, thereby forming the light emitting diode (LED) ED. At this time, the pixel electrode 191 may be the anode, and the common electrode 270 may be the cathode.

Next, the arrangement shape of the fourth conductive layer of the display device according to an embodiment is described with reference to FIG. 8.

Figure 8:
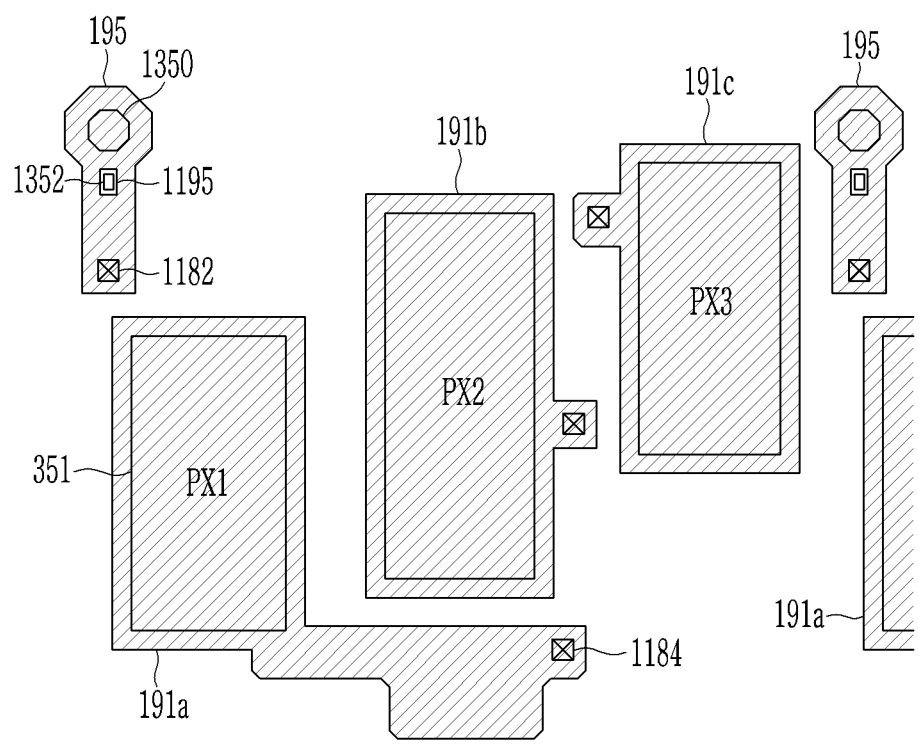
FIG. 8 is a schematic top plan view showing layers of a display device according to an embodiment.

FIG. 8 is a schematic top plan view showing layers of a display device according to an embodiment. FIG. 8 shows a fourth conductive layer.

The display device according to an embodiment may include pixels PX1, PX2, and PX3, and each pixel may include a pixel electrode 191a, 191b, and 191c, respectively. Pixels PX1, PX2, and PX3 may include a first pixel PX1, a second pixel PX2, and a third pixel PX3. The first pixel PX1, the second pixel PX2, and the third pixel PX3 may display different colors. For example, the first pixel PX1 may be a pixel displaying red, the second pixel PX2 may be a pixel displaying green, and the third pixel PX3 may be a pixel displaying blue. However, the colors displayed by the first pixel PX1, the second pixel PX2, and the third pixel PX3 are not limited thereto, and may be variously changed. The first pixel electrode 191a may be disposed in the first pixel PX1, the second pixel electrode 191b may be disposed in the second pixel PX2, and the third pixel electrode 191c may be disposed in the third pixel PX3. The first pixel electrode 191a, the second pixel electrode 191b, and the third pixel electrode 191c may be disposed side by side adjacent to each other. For example, the second pixel electrode 191b may be disposed to the right of the first pixel electrode 191a, and the third pixel electrode 191c may be disposed to the right of the second pixel electrode 191b.

One connection electrode 195 may be disposed for every three pixels PX1, PX2, and PX3. For example, the connection electrode 195 may be disposed in the region between the first pixel PX1 and the third pixel PX3. The connection electrode 195 may be adjacent to the first pixel electrode 191a and the third pixel electrode 191c. The connection electrode 195 may be disposed above the first pixel electrode 191a in a plan view and may be disposed on the right side of the third pixel electrode 191c. However, this is only an example, and the number of connection electrodes 195 may be further decreased or increased, and their positions may be changed in various ways.

Next, a display device according to a comparative example is described with reference to FIG. 9 and FIG. 10.

Figure 9:
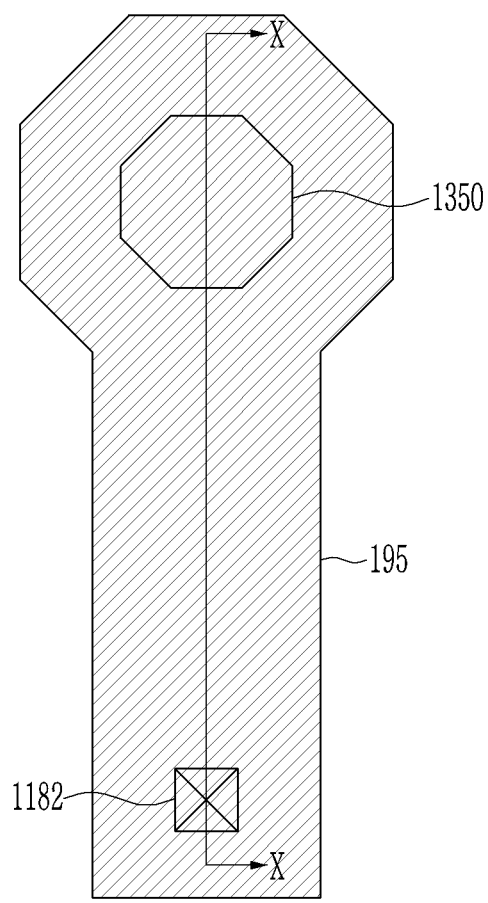
FIG. 9 is a schematic top plan view showing a part of a display device according to a comparative example.
Figure 10:
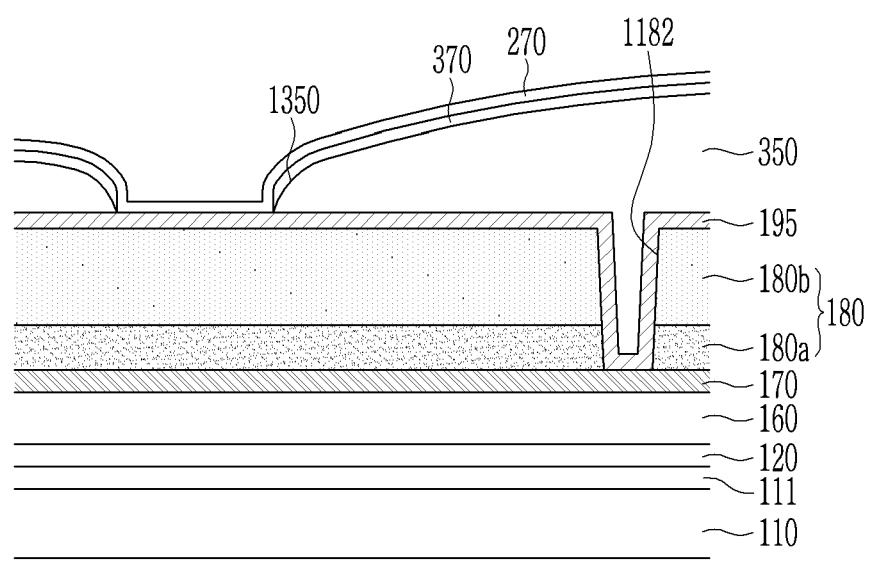
FIG. 10 is a schematic cross-sectional view taken along line X-X of FIG. 9.

FIG. 9 is a schematic top plan view showing a part of a display device according to a comparative example, and FIG. 10 is a schematic cross-sectional view taken along line X-X of FIG. 9.

As shown in FIG. 9 and FIG. 10, the display device according to comparative example may include a substrate 110, a common voltage line 170 disposed on the substrate 110, a passivation layer 180 disposed on the common voltage line 170, a passivation layer 180 disposed on the connection electrode 195, a pixel definition layer 350 disposed on the connection electrode 195, an emission layer 370 disposed on the pixel definition layer 350, and a common electrode 270 disposed on the emission layer 370.

The passivation layer 180 may include a sixth opening 1182, and the connection electrode 195 may be connected to the common voltage line 170 through the sixth opening 1182. In the display device according to a comparative example, the passivation layer 180 may not include a first opening. The pixel definition layer 350 may include a first opening 1350, and the common electrode 270 may be connected to the connection electrode 270 through the first opening 1350. In the display device according to a comparative example, the pixel definition layer 350 may not include the second opening.

In the display device according to an embodiment, the second opening 1180 of the passivation layer 180 may be formed to surround the first opening 1350 of the pixel definition layer 350. In the display device according to a comparative example, an opening of the passivation layer 180 may not be formed around the first opening 1350 of the pixel definition layer 350. Also, in the display device according to an embodiment, the third opening 1195 of the connection electrode 195 and the fourth opening 1352 of the pixel definition layer 350 may be formed within the region surrounded by the second opening 1180 of the passivation layer 180, and the third opening 1195 of the connection electrode 195 and the fourth opening 1352 of the pixel definition layer 350 may overlap each other. In the display device according to a comparative example, an opening may not be formed in the connection electrode 195, and therefore, there may be no overlap between the opening of the pixel definition layer and the opening of the connection electrode.

There may be differences in effects depending on the structural differences between the display device according to the comparative example and the display device according to an embodiment, and these differences are described with reference to FIG. 11 to FIG. 16.

Figure 11:
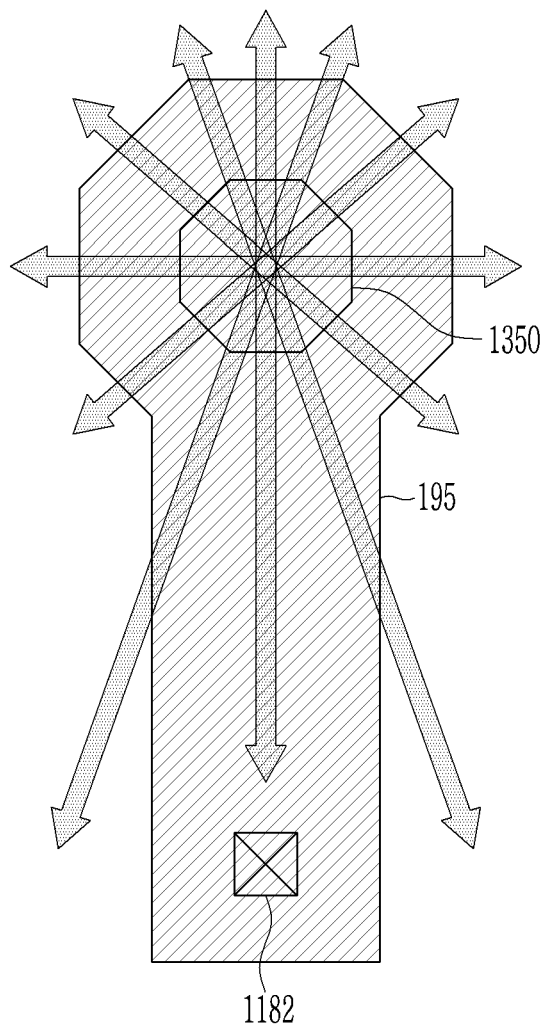
FIG. 11 to FIG. 13 are schematic views showing a movement path of a gas generated from a display device according to a comparative example.
Figure 12:
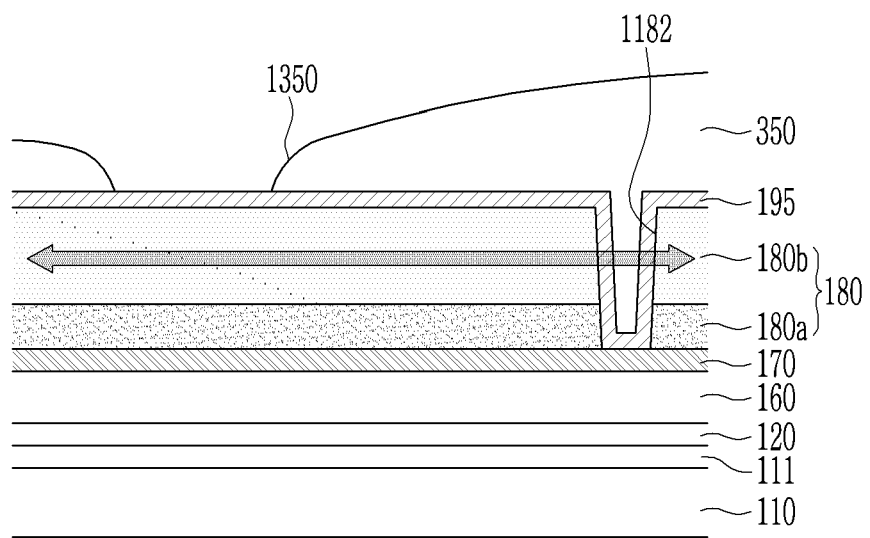
Figure 13:
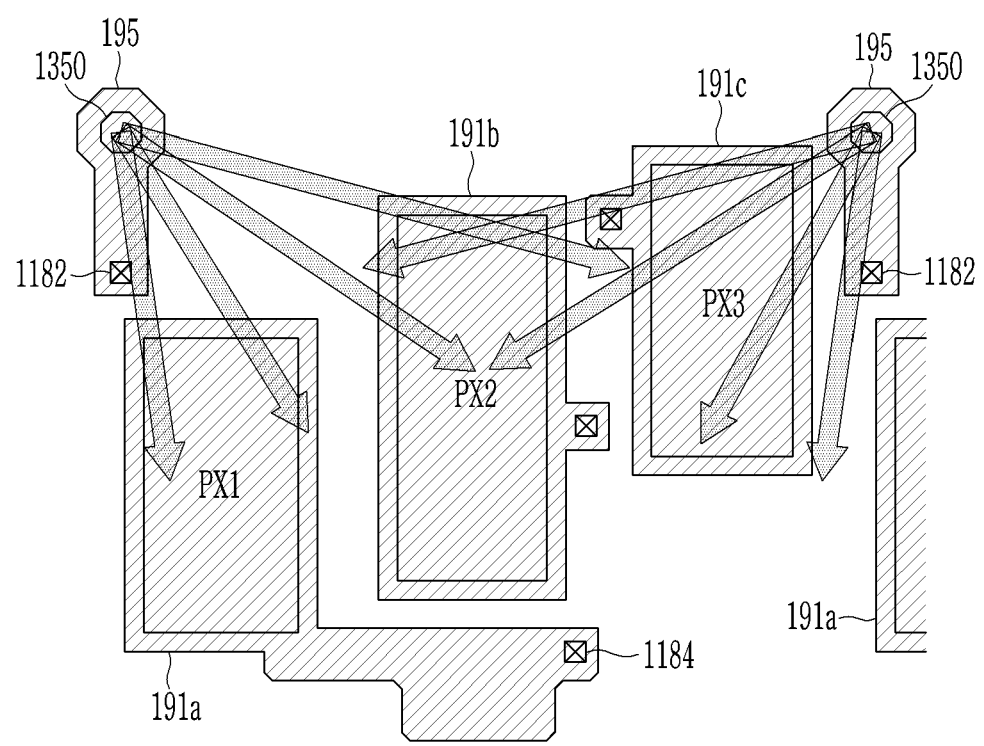
Figure 14:
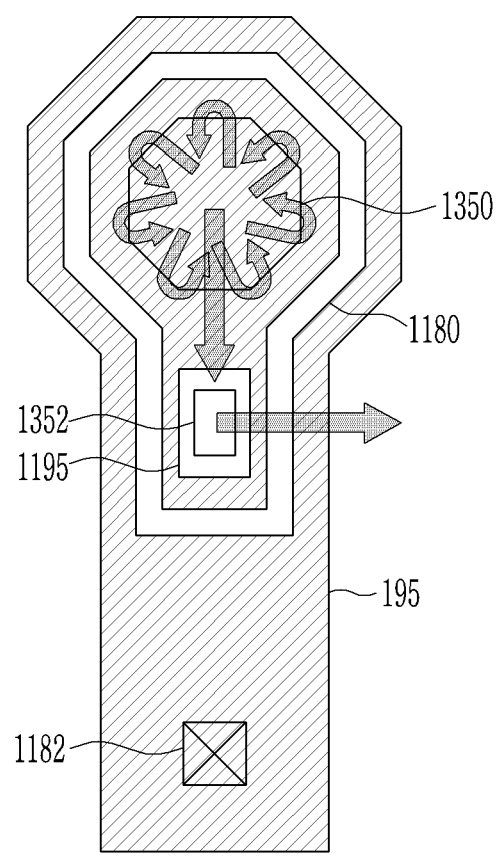
FIG. 14 to FIG. 16 are schematic views showing a movement path of a gas generated from a display device according to an embodiment.
Figure 15:
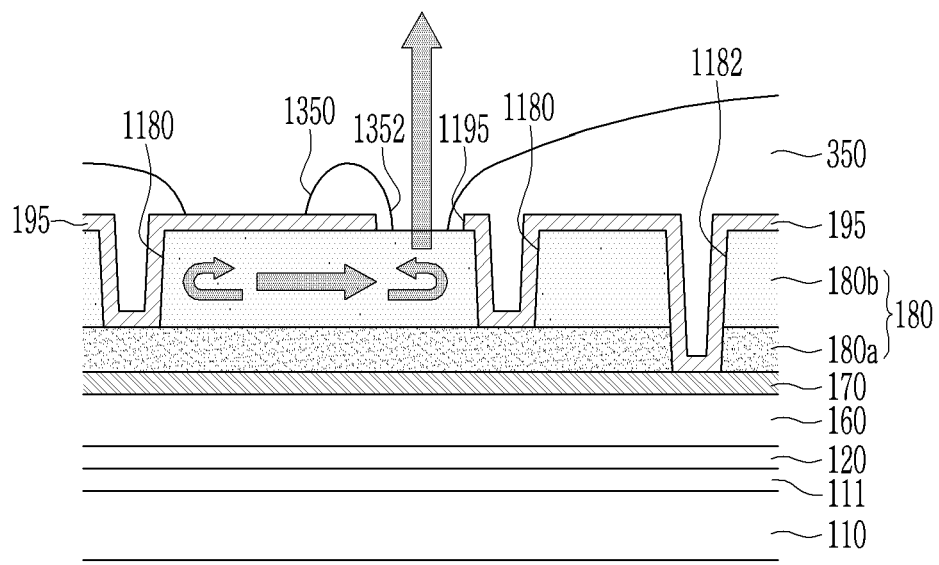
Figure 16:
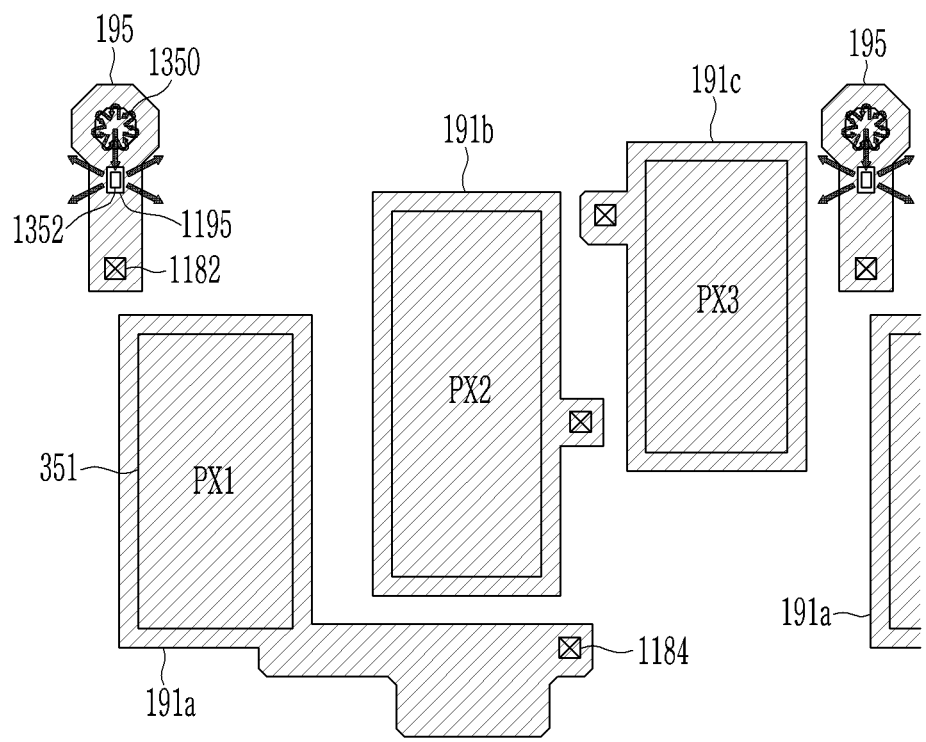

FIG. 11 to FIG. 13 are schematic views showing a movement path of a gas generated from a display device according to a comparative example, and FIG. 14 to FIG. 16 are schematic views showing a movement path of a gas generated from a display device according to an embodiment. FIG. 11, FIG. 13, FIG. 14, and FIG. 16 are schematic top plan views, and FIG. 12 and FIG. 15 are schematic cross-sectional views.

As shown in FIG. 11 to FIG. 13, in the display device according to the comparative example, after forming the emission layer 370 on the pixel definition layer 350, if a laser is irradiated to the part corresponding to the first opening 1350 of the pixel definition layer 350, the part of the emission layer 370 disposed within the first opening 1350 of the pixel definition layer 350 may be removed. This laser drilling process may be performed at a high temperature, and a gas may be generated in the passivation layer 180 disposed under the laser irradiated part. At this time, the gas may be generated in the second passivation layer 180b made of an organic insulating material among the passivation layer 180. The generated gas may move along the second passivation layer 180b. The gas may move in all directions around the laser-irradiated part. The gas may reach the pixels PX1, PX2, and PX3 disposed around the laser irradiated area. For each pixel PX1, PX2, and PX3, the pixel electrodes 191a, 191b, and 191c may be disposed, and the emission layer 370 may be disposed on the pixel electrodes 191a, 191b, and 191c. The emission layer 370 may be in contact with the pixel electrodes 191a, 191b, and 191c. The gas moved to each pixel PX1, PX2, and PX3 may affect the emission layer 370 of each pixel PX1, PX2, and PX3, and defects such as degradation of the emission layer 370 may occur.

As shown in FIG. 14 to FIG. 16, in the display device according to an embodiment, after forming the emission layer 370 on the pixel definition layer 350, if the laser drilling process is performed, the part of the emission layer 370 disposed within the first opening 1350 of the pixel definition layer 350 may be removed. In this process, the gas may be generated in the passivation layer 180, particularly in the second passivation layer 180b made of an organic insulating material. The generated gas may move along the second passivation layer 180b and may be blocked by the connection electrode 195 and may not move to other adjacent elements. In the display device according to an embodiment, the second opening 1180 may be formed in the passivation layer 180, and the second opening 1180 may surround the first opening 1350 of the pixel definition layer 350. The connection electrode 195 may be disposed within the second opening 1180 of the passivation layer 180, and the connection electrode 195 may be formed to cover the side of the passivation layer 180 within the second opening 1180. Accordingly, a portion of the second passivation layer 180b surrounded by the second opening 1180 and a portion of the second passivation layer 180b disposed outside the second opening 1180 may be separated by the connection electrode 195. The gas generated in the portion of the second passivation layer 180b surrounded by the second opening 1180 may be blocked by the connection electrode 195 and may not move to the portion of the second passivation layer 180b disposed outside the second opening 1180. Therefore, the gas may not reach the pixels PX1, PX2, and PX3 disposed around the laser irradiated area and may not affect the emission layer 370 of each pixel PX1, PX2, and PX3, thereby preventing the emission layer 370 from being defective.

In the display device according to an embodiment, the third opening 1195 of the connection electrode 195 and the fourth opening 1352 of the pixel definition layer 350 may be formed in the region surrounded by the second opening 1180 of the passivation layer 180. As the third opening 1195 of the connection electrode 195 and the fourth opening 1352 of the pixel definition layer 350 overlap each other, the gas blocked by the connection electrode 195 may be discharged to the outside through the third opening 1195 of the connection electrode 195 and the fourth opening 1352 of the pixel definition layer 350. For example, by releasing the gas generated in the passivation layer 180 in the laser drilling process to the outside, the effect on other elements may be minimized.

Next, the display device according to an embodiment is described with reference to FIG. 17.

Figure 17:
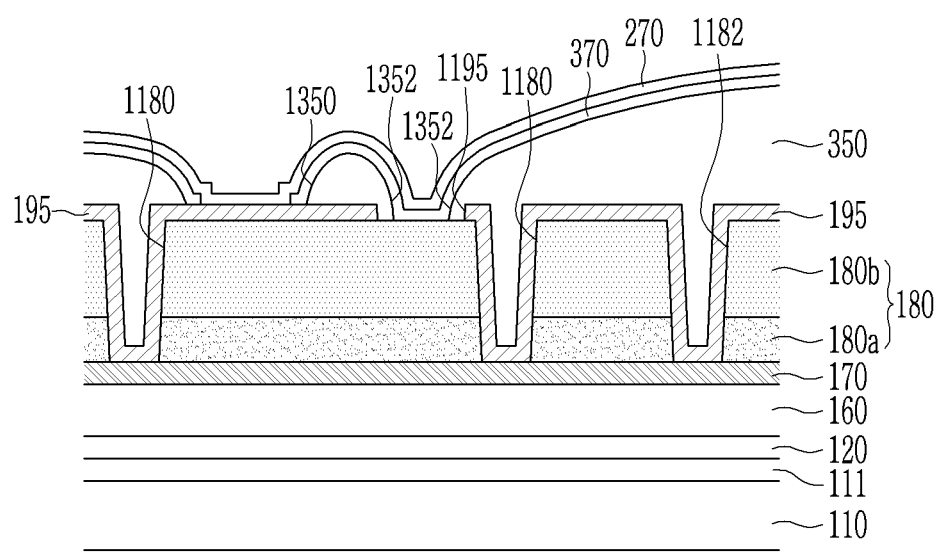
FIG. 17 is a schematic cross-sectional view showing a display device according to an embodiment.

The display device according to an embodiment shown in FIG. 17 may be the same as most of the display device according to an embodiment shown in FIG. 1 to FIG. 8, and the description of the same parts is omitted. An embodiment may be different from previous embodiments in that the second opening 1180 of the passivation layer 180 may be formed not only in the second passivation layer 180b but also in the first passivation layer 180a, and is further described below.

FIG. 17 is a schematic cross-sectional view showing a display device according to an embodiment.

As shown in FIG. 17, the display device according to an embodiment may include a substrate 110, a common voltage line 170 disposed on the substrate 110, a passivation layer 180 disposed on the common voltage line 170, a connection electrode 195 disposed on the passivation layer 180, a pixel definition layer 350 disposed on the connection electrode 195, an emission layer 370 disposed on the pixel definition layer 350, and a common electrode 270 disposed on the emission layer 370.

The passivation layer 180 may include a second opening 1180 and a sixth opening 1182. In a previous embodiment, the second opening 1180 may be formed only on the second passivation layer 180b and may not be formed on the first passivation layer 180a. In an embodiment of FIG. 17, the second opening 1180 may be formed on the first passivation layer 180a and the second passivation layer 180b. The depth of the second opening 1180 may correspond to the thickness of the passivation layer 180, and by forming the second opening 1180, a portion of the common voltage line 170 overlapping the second opening 1180 may be exposed. The common electrode 270 may be disposed within the second opening 1180 of the passivation layer 180, and the common electrode 270 may be connected to the common voltage line 170 through the second opening 1180. Also, the common electrode 270 may be connected to the common voltage line 170 through the sixth opening 1182. Therefore, according to an embodiment, the area of the part where the common electrode 270 and the common voltage line 170 may be connected may be increased compared to a previous embodiment, and the resistance of the common electrode 270 may be further reduced. Since the second opening 1180 and the sixth opening 1182 may be formed simultaneously using a same mask, the process may be simplified and the cost may be reduced.

In the above, it has been described that the passivation layer 180 may include the second opening 1180 and the sixth opening 1182, but embodiments are not limited thereto. In some cases, the sixth opening 1182 may be omitted. Since the connection between the common electrode 270 and the common voltage line 170 may be made by the second opening 1180, the sixth opening 1182 may be omitted. As a result, the area occupied by the connection electrode 195 may be reduced, and a high-resolution design may be made easier.

Next, a display device according to an embodiment is described with reference to FIG. 18 and FIG. 19.

Figure 18:
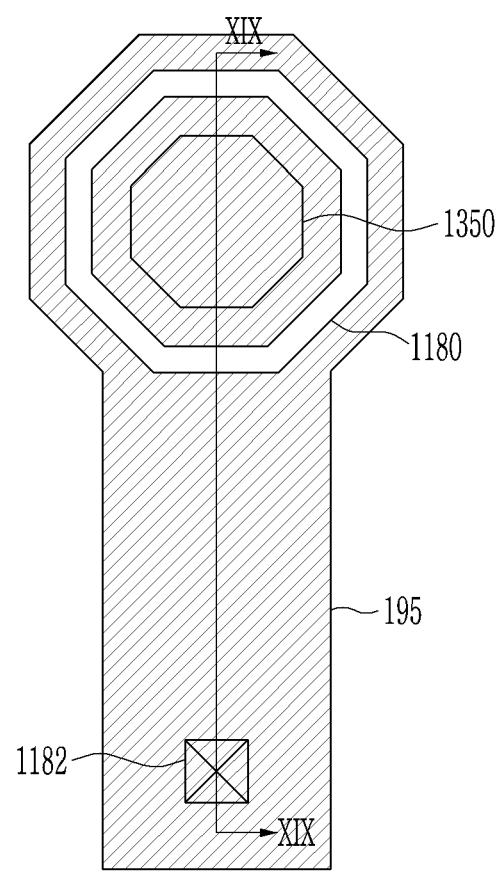
FIG. 18 is a schematic top plan view showing a part of a display device according to an embodiment.
Figure 19:
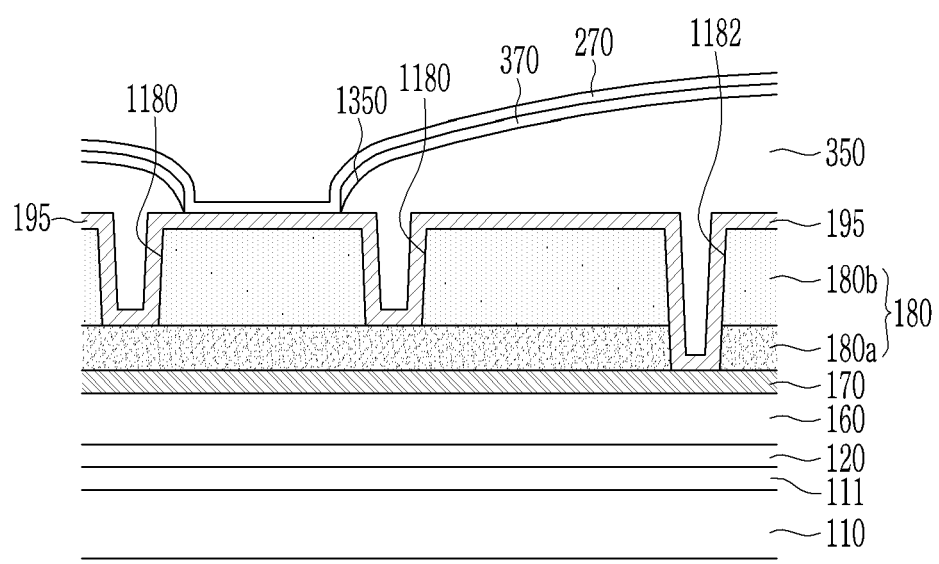
FIG. 19 is a schematic cross-sectional view taken along line XIX-XIX of FIG. 18.

The display device according to an embodiment shown in FIG. 18 and FIG. 19 may be the same as most of the display device according to an embodiment shown in FIG. 1 to FIG. 8, so the description for the same parts is omitted. An embodiment may be different from previous embodiments in that the third opening 1195 may be not formed in the connection electrode 195, and is further described below.

FIG. 18 is a schematic top plan view showing a part of a display device according to an embodiment, and FIG. 19 is a schematic cross-sectional view taken along line XIX-XIX of FIG. 18.

As shown in FIG. 18 and FIG. 19, a display device according to an embodiment may include a substrate 110, a common voltage line 170 disposed on the substrate 110, a passivation layer 180 disposed on the common voltage line 170, a connection electrode 195 disposed on the passivation layer 180, a pixel definition layer 350 disposed on the connection electrode 195, an emission layer 370 disposed on the pixel definition layer 350, and a common electrode 270 disposed on the emission layer 370.

The passivation layer 180 may include a second opening 1180 and a sixth opening 1182, and the connection electrode 195 may be disposed within the second opening 1180 and the sixth opening 1182. In a previous embodiment, the connection electrode 195 may include a third opening 1195. In an embodiment of FIG. 18 and FIG. 19, the connection electrode 195 may not include an opening. In a previous embodiment, the second opening 1180 of the passivation layer 180 may overlap the approximately octagonal portion of the connection electrode 195 and the region around it. In an embodiment of FIG. 18 and FIG. 19, the second opening 1180 of the passivation layer 180 may only overlap the approximately octagonal portion of the connection electrode 195.

The pixel definition layer 350 may include a first opening 1350. In a previous embodiment, the pixel definition layer 350 may include a first opening 1350 and a fourth opening 1352. In an embodiment of FIG. 18 and FIG. 19, the pixel definition layer 350 may include a first opening 1350 and may not include a fourth opening 1352.

In an embodiment of FIG. 18 and FIG. 19, the gas generated in the portion of the second passivation layer 180*b* surrounded by the second opening 1180 may be blocked by the connection electrode 195 and may not move to the portion of the second passivation layer 180*b* disposed outside the second opening 1180. Therefore, it may be possible to prevent the gas from affecting the pixels disposed around the laser-irradiated area.

In an embodiment, since no opening may be formed in the connection electrode 195, the gas generated from the passivation layer 180 may not be released to the outside and may be trapped in the second passivation layer 180*b* surrounded by the second opening 1180.

Next, a display device according to an embodiment is described with reference to FIG. 20 and FIG. 21.

Figure 20:
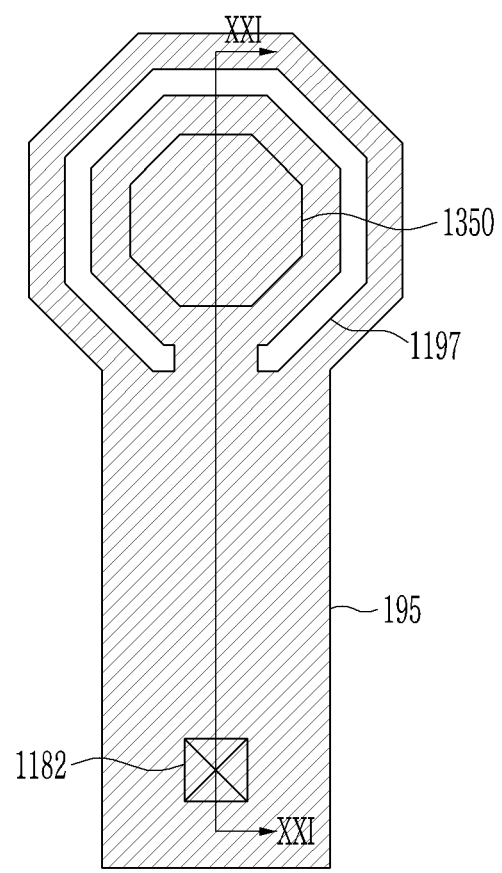
FIG. 20 is a schematic top plan view showing a part of a display device according to an embodiment.
Figure 21:
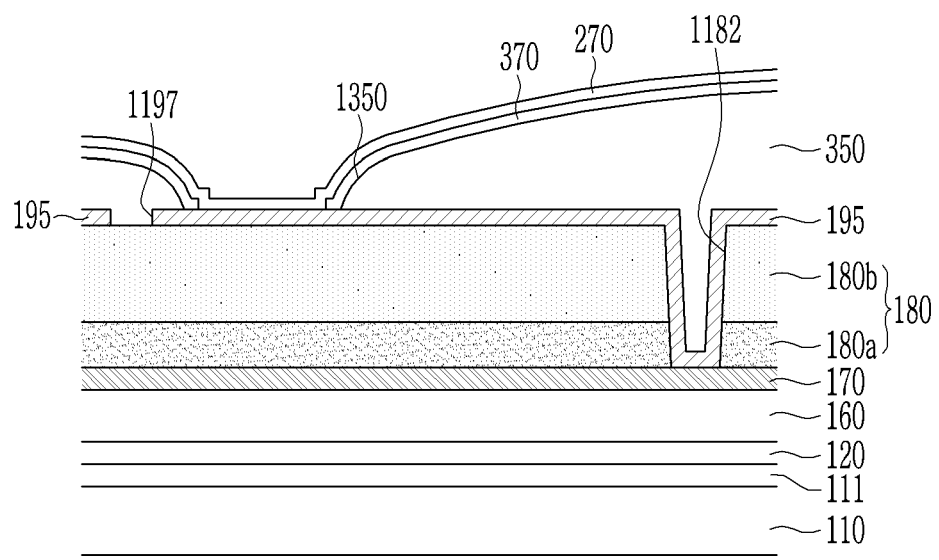
FIG. 21 is a schematic cross-sectional view taken along line XXI-XXI of FIG. 20.

The display device according to an embodiment shown in FIG. 20 and FIG. 21 may be the same as most of the display device according to an embodiment shown in FIG. 1 to FIG. 8, so the description for the same parts is omitted. An embodiment may be different from a previous embodiment in that the second opening 1180 may not be formed in the passivation layer 180 and the shape of the third opening 1195 of the connection electrode 195 may be different from a previous embodiment, and will be further described below.

FIG. 20 is a schematic top plan view showing a part of a display device according to an embodiment, and FIG. 21 is a schematic cross-sectional view taken along line XXI-XXI of FIG. 20.

As shown in FIG. 20 and FIG. 21, a display device according to an embodiment may include a substrate 110, a common voltage line 170 disposed on the substrate 110, a passivation layer 180 disposed on the common voltage line 170, a connection electrode 195 disposed on the passivation layer 180, a pixel definition layer 350 disposed on the connection electrode 195, an emission layer 370 disposed on the pixel definition layer 350, and a common electrode 270 disposed on the emission layer 370.

The passivation layer 180 may include a sixth opening 1182, and the connection electrode 195 may be connected to the common voltage line 170 through the sixth opening 1182. In the previous embodiment, the passivation layer 180 may further include a second opening 1180. In an embodiment, the passivation layer 180 may not include a first opening. An opening may not be formed in the passivation layer 180 so as to surround the first opening 1350 of the pixel definition layer 350, and the vicinity of the laser irradiated portion may not be blocked by the connection electrode 195.

In an embodiment, the connection electrode 195 may include a fifth opening 1197. The fifth opening 1197 may be formed to surround at least a portion of the first opening 1350 of the pixel definition layer 350. The fifth opening 1197 of the connection electrode 195 may not be formed to enclose the first opening 1350 (e.g., entire first opening) of the pixel definition layer 350. For example, the fifth opening 1197 of the connection electrode 195 may be formed to surround about 50% or more and about 90% or less of the first opening 1350 of the pixel definition layer 350. In case that the first opening 1350 of the pixel definition layer 350 is approximately octagonal in a plan view, the seven sides may be surrounded by the fifth opening 1197 of the connection electrode 195 and another side may not be surrounded by the fifth opening 1197 of the connection electrode 195. In case that the fifth opening 1197 of the connection electrode 195 is formed to surround the first opening 1350 (e.g., entire first opening) of the pixel definition layer 350, the part of the connection electrode 195 disposed inside the fifth opening 1197 and the part of the connection electrode 195 disposed outside the fifth opening 1197 may not be connected to each other. Therefore, the fifth opening 1197 may be formed in an opened loop shape and may not be formed in a closed loop shape so that the part of the connection electrode 195 disposed inside the fifth opening 1197 and the part of the connection electrode 195 disposed outside the fifth opening 1197 may be connected to each other. However, embodiments are not limited thereto, and the fifth opening 1197 may be formed in a closed loop shape. At this time, a bridge electrode connecting the part of the connection electrode 195 disposed inside the fifth opening 1197 and the part of the connection electrode 195 disposed outside the fifth opening 1197 may be separately formed.

The fifth opening 1197 of the connection electrode 195 may not overlap the first opening 1350 of the pixel definition layer 350. The fifth opening 1197 of the connection electrode 195 may be covered by the pixel definition layer 350. At this time, the fifth opening 1197 of the connection electrode 195 may be covered (e.g., entirely covered) by the pixel definition layer 350. Therefore, it may be possible to protect the connection electrode 195 by preventing the side surface of the connection electrode 195 from being exposed.

In the display device according to an embodiment, the connection electrode 195 may include the fifth opening 1197 surrounding at least a portion of the first opening 1350 of the pixel definition layer 350, so that the gas generated in the passivation layer 180 in the laser drilling process may be discharged to the outside through the fifth opening 1197 of the connection electrode 195. Therefore, it may be possible to prevent the gas generated in the passivation layer 180 from moving to the adjacent pixels PX1, PX2, and PX3. For example, by releasing the gas generated in the passivation layer 180 in the laser drilling process to the outside, the effect on other devices may be minimized.

Next, a cross-section structure of a display device according to an embodiment is described with reference to FIG. 22. It is explained together with reference to FIG. 1 to FIG. 8 described above. In FIG. 7 above, it was explained that the common electrode may be disposed at the upmost layer. Other layers may be disposed above the common electrode, and are further described below.

Figure 22:
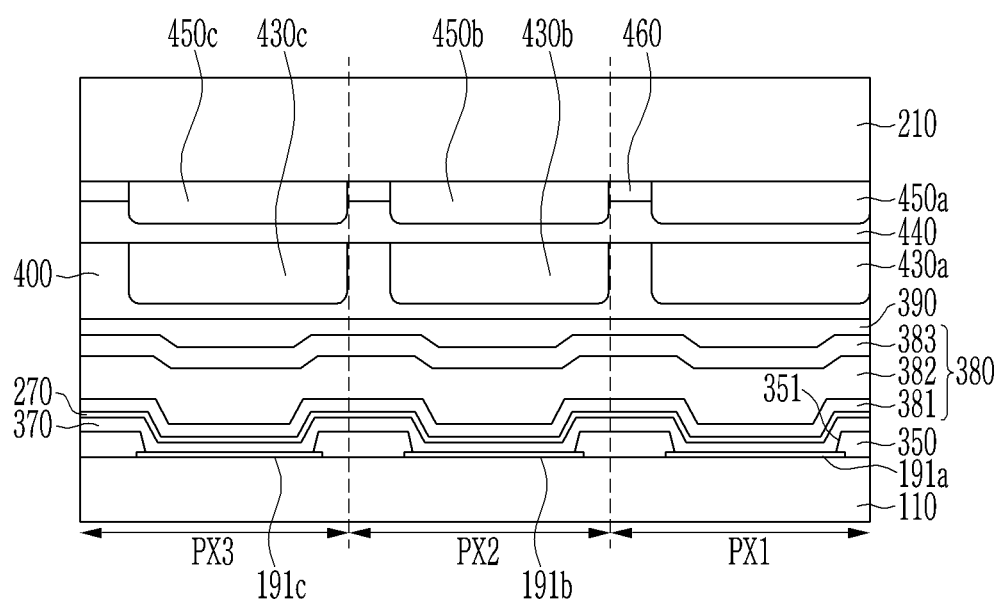
FIG. 22 is a schematic cross-sectional view showing constituent elements of a display device according to an embodiment.

FIG. 22 is a schematic cross-sectional view showing constituent elements of a display device according to an embodiment. In FIG. 22, the illustration of the first to third conductive layers, etc. of the display device according to an embodiment shown in FIG. 7 is omitted, and some constituent elements such as the pixel electrode, the emission layer, and the common electrode are shown. Also, FIG. 22 further shows other layers disposed on the common electrode.

As shown in FIG. 22, the display device according to an embodiment may include pixels PX1, PX2, and PX3. On the substrate 110, the pixel electrodes 191a, 191b, and 191c may be disposed for each pixel PX1, PX2, and PX3. Transistors and insulating layers disposed between the substrate 110 and the pixel electrodes 191a, 191b, and 191c are not shown and are omitted.

A pixel definition layer 350 may be disposed on the pixel electrodes 191a, 191b, and 191c, and the pixel definition layer 350 may include a pixel opening 351. An emission layer 370 may be disposed on the pixel electrodes 191a, 191b, and 191c and the pixel definition layer 350, and a common electrode 270 may be disposed on the emission layer 370. The emission layer 370 may include a light-emitting material that emits a first color light, which may be blue light.

An encapsulation layer 380 including multiple insulating layers 381, 382, and 383 may be disposed on the common electrode 270. The insulating layer 381 and the insulating layer 383 may include an inorganic insulating material, and the insulating layer 382 disposed between the insulating layer 381 and the insulating layer 383 may include an organic insulating material.

On the encapsulation layer 380, a filling layer 390 including a filler may be disposed. A covering layer 400, color conversion layer 430a and 430b, and a transmission layer 430c including an insulating material may be disposed on the filling layer 390.

The transmission layer 430c may pass incident light. For example, the transmission layer 430c may transmit a first color light, which may be blue light. The transmission layer 430c may include a polymer material that transmits the first color light. The region in which the transmission layer 430c may be disposed may correspond to a light emitting region that emits blue, and the transmission layer 430c may pass incident first color light as it is without including a separate semiconductor nanocrystal.

The color conversion layers 430a and 430b may include different semiconductor nanocrystals. For example, the first color light incident on the color conversion layer 430a may be converted into a second color light by a semiconductor nanocrystal included in the color conversion layer 430a and emitted. The first color light incident on the color conversion layer 430b may be converted into a third color light by a semiconductor nanocrystal included in the color conversion layer 430b and emitted.

The semiconductor nanocrystal may include at least one of a phosphor and a quantum dot material that converts the incident first color light into the second color light or the third color light.

A core of the quantum dot may be selected from a Group II-VI compound, a Group III-V compound, a Group IV-VI compound, a Group IV element, a Group IV compound, and a combination thereof.

The Group II-VI compound may be selected from the group including a binary compound selected from the group of CdSe, CdTe, ZnS, ZnSe, ZnTe, ZnO, HgS, HgSe, HgTe, MgSe, MgS, and a mixture thereof; a ternary compound selected from the group of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-V compound may be selected from the group including a binary compound selected from the group of GaN, GaP, GaAs, GaSb, AN, AlP, AlAs, AlSb, InN, InP, InAs, InSb, and a mixture thereof; a ternary compound selected from the group of GaNP, GaNAs, GaNSb, GaPAs, GaPSb, AlNP, ANAs, AlNSb, AlPAs, AlPSb, InNP, InNAs, InNSb, InPAs, InPSb, and a mixture thereof; and a quaternary compound selected from the group of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The Group IV-VI compound may be selected from the group including a binary compound selected from the group of SnS, SnSe, SnTe, PbS, PbSe, PbTe, and a mixture thereof; a ternary compound selected from the group of SnSeS, SnSeTe, SnSTe, PbSeS, PbSeTe, PbSTe, SnPbS, SnPbSe, SnPbTe, and a mixture thereof; and a quaternary compound selected from the group of SnPbSSe, SnPbSeTe, SnPbSTe, and a mixture thereof. The Group IV element may be selected from the group of Si, Ge, and a mixture thereof. The Group IV compound may be a binary compound selected from the group of SiC, SiGe, and a mixture thereof.

The binary compound, the ternary compound, or the quaternary compound may exist in particles at a uniform concentration, or may exist in the same particle divided into states where concentration distributions may be partially different. Further, the color conversion media layer may have a core/shell structure where one quantum dot surrounds another quantum dot. An interface between the core and the shell may have a concentration gradient, such that a concentration of an element existing in the shell may be gradually reduced toward the center thereof.

In some embodiments, the quantum dot may have a core-shell structure including the core including the nanocrystal described above and a shell surrounding the core. The shell of the quantum dot may serve as a protective layer to prevent chemical denaturation of the core and/or to serve as a charging layer to impart electrophoretic characteristics to the quantum dot. The shell may be a single layer or a multiple layer. The interface between the core and the shell may have a concentration gradient in which the concentration of the elements existing in the shell decreases toward the center. Examples of the shells of the quantum dot include metal or non-metal oxides, semiconductor compounds, or combinations thereof.

For example, the metal or nonmetal oxide may be a binary compound such as $SiO_2$, $Al_2O_3$, $TiO_2$, $ZnO$, $MnO$, $Mn_2O_3$, Mn3O4, CuO, FeO, Fe2O3, Fe3O4, CoO, Co3O4, and NiO, or a ternary compound such as MgAl2O4, CoFe2O4, NiFe2O4, and CoMn2O4, but embodiments are not limited thereto.

Also, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb, however embodiments are not limited thereto.

The quantum dot may have a full width at half maximum (FWHM) of an emission wavelength spectrum of about 45 nm or less, for example about 40 nm or less, and as another example about 30 nm or less, and in this range, color purity or color reproducibility may be improved. Also, since the light emitted through the quantum dot may be emitted in all directions, the light viewing angle may be improved.

Further, a form of the quantum dot may be one generally used and is not particularly limited, but more specifically, forms such as spherical, pyramidal, multi-arm-shaped, or cubic nanoparticles, nanotubes, nanowires, nanofibers, and nanoplate-shaped particles may be used.

The quantum dot may adjust the color of emitted light depending on the particle size, so the quantum dot can have various luminescent colors such as blue, red, and green.

An insulating layer 440 may be disposed on the color conversion layers 430a and 430b and the transmissive layer 430c, and color filters 450a, 450b, and 450c and a light blocking member 460 may be disposed thereon.

The color filter 450a may represent a second color light, the color filter 450b may represent a third color light, and the color filter 450c may represent a first color light.

The light blocking member 460 may be disposed between neighboring color filters 450a, 450b, and 450c.

A substrate 210 may be disposed on the color filters 450a, 450b, and 450c and the light blocking member 460. For example, the color conversion layers 430a and 430b and the color filters 450a, 450b, and 450c may be disposed between the substrate 110 and the substrate 210.

According to another embodiment, the emission layer 370 may include the quantum dot instead of the color conversion layers 430a and 430b and the transmissive layer 430c.

While this disclosure has been described in connection with what is considered to be practical embodiments, it is to be understood that the disclosure is not limited to the disclosed embodiments. On the contrary, the disclosure is intended to cover various modifications and equivalent arrangements included within the spirit and scope of the appended claims including equivalents thereof.

What is claimed is:

1. A display device comprising:
   a common voltage line disposed on a substrate;
   a passivation layer disposed on the common voltage line;
   a connection electrode disposed on the passivation layer and electrically connected to the common voltage line;
   a pixel definition layer disposed on the connection electrode and including a first opening exposing a portion of the connection electrode;
   an emission layer disposed on the pixel definition layer; and
   a common electrode disposed on the emission layer and electrically connected to the connection electrode through the first opening, wherein
   the passivation layer includes a second opening surrounding the first opening, and
   the common electrode directly contacts the portion of the connection electrode exposed by the first opening of the pixel definition layer.

2. The display device of claim 1, wherein the connection electrode is disposed within the second opening.

3. The display device of claim 2, wherein the connection electrode covers a side of the passivation layer within the second opening.

4. The display device of claim 3, wherein a portion of the passivation layer surrounded by the second opening and a portion of the passivation layer disposed outside the second opening are separated by the connection electrode.

5. The display device of claim 2, wherein the second opening has a closed loop shape in a plan view.

6. The display device of claim 2, wherein the first opening does not overlap the second opening.

7. The display device of claim 2, wherein the passivation layer includes:
   a first passivation layer including an inorganic insulating material; and
   a second passivation layer disposed on the first passivation layer and including an organic insulating material.

8. The display device of claim 7, wherein the second opening is disposed in the second passivation layer and is not disposed in the first passivation layer.

9. The display device of claim 7, wherein
   the second opening is disposed in the first passivation layer and the second passivation layer.

10. The display device of claim 9, wherein the connection electrode is electrically connected to the common voltage line through the second opening.

11. The display device of claim 2, wherein
    the connection electrode includes a third opening, and
    the third opening is surrounded by the second opening.

12. The display device of claim 11, wherein the third opening overlaps a portion of the passivation layer surrounded by the second opening.

13. The display device of claim 11, wherein the pixel definition layer further includes a fourth opening overlapping the third opening.

14. The display device of claim 13, wherein a size of the fourth opening is smaller than a size of the third opening in a plan view.

15. The display device of claim 14, wherein the pixel definition layer covers a side of the connection electrode within the third opening.

16. The display device of claim 1, wherein the emission layer is not disposed in at least a partial region within the first opening.

* * * * *